United States Patent
Aqad et al.

(10) Patent No.: US 11,448,960 B2
(45) Date of Patent: *Sep. 20, 2022

(54) SALTS AND PHOTORESISTS COMPRISING SAME

(71) Applicant: Rohm and Haas Electronic Materials LLC, Marlborough, MA (US)

(72) Inventors: Emad Aqad, Nothborough, MA (US); James F. Cameron, Marlborough, MA (US); James W. Thackeray, Marlborough, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/205,055

(22) Filed: Nov. 29, 2018

(65) Prior Publication Data

US 2019/0163055 A1 May 30, 2019

Related U.S. Application Data

(60) Provisional application No. 62/593,229, filed on Nov. 30, 2017.

(51) Int. Cl.
| | | |
|---|---|---|
| *G03F 7/00* | (2006.01) | |
| *G03F 7/004* | (2006.01) | |
| *G03F 7/16* | (2006.01) | |
| *C07F 11/00* | (2006.01) | |
| *G03F 7/027* | (2006.01) | |
| *G03F 7/039* | (2006.01) | |
| *G03F 7/20* | (2006.01) | |

(52) U.S. Cl.
CPC ............ *G03F 7/0042* (2013.01); *C07F 11/00* (2013.01); *G03F 7/0045* (2013.01); *G03F 7/027* (2013.01); *G03F 7/0397* (2013.01); *G03F 7/16* (2013.01); *G03F 7/70033* (2013.01)

(58) Field of Classification Search
CPC ....................................................... G03F 7/00
See application file for complete search history.

(56) References Cited

U.S. PATENT DOCUMENTS

| | | | |
|---|---|---|---|
| 4,155,761 A | 5/1979 | Lelental et al. | |
| 4,784,785 A * | 11/1988 | Cordani | C23F 1/34 |
| | | | 216/100 |
| 8,039,194 B2 | 10/2011 | Glodde | |
| 8,652,712 B2 | 2/2014 | Glodde | |
| 2015/0021289 A1 | 1/2015 | Ober et al. | |
| 2015/0177613 A1 | 6/2015 | Jain et al. | |

FOREIGN PATENT DOCUMENTS

| | | | |
|---|---|---|---|
| JP | H02-158730 A | 6/1990 | |
| JP | H02-158730 * | 6/1996 | |
| JP | 2005128049 A * | 5/2005 | |
| WO | WO-2017188450 A1 * | 11/2017 | ............. C08G 79/00 |

OTHER PUBLICATIONS

Karaghiosoff et al. (Inorg. Chem. 2009, 48, 7531-7533). (Year: 2009).*
Burrow et al. (J. Braz. Chem. Soc., vol. 17, No. 8, 1566-1570, (2006)). (Year: 2006).*
Fukunaga, Mari et al., "Synthesis and Property of Tellurium-Containing Polymer for Extreme Ultraviolet Resist Material." Journal of Photopolymer Science and Technology, vol. 30, No. 1, pp. 103-107.
Journal of Organic Chemistry, vol. 64, pp. 8161-8169, 1999.
CAS Registry No. 22545-50-2 (Nov. 16, 1984).
CAS Registry No. 1415668-11-9 (Dec. 28, 2012).
CAS Registry No. 252025-18-6 (Jan. 3, 2000).
CAS Registry No. 56192-10-0 (Nov. 16, 1984).
English language summary of Office Action and Search Report issued in counterpart Taiwan Patent Application No. 107142202.
English language abstract of JP2005-280494.
English language summary of Office Action dated Feb. 3, 2020 of counterpart Korean application 10-2018-0149710.
English language summary of Office Action dated Jul. 8, 2020 issued in counterpart Japanese application 2018-221122.

* cited by examiner

*Primary Examiner* — Chanceity N Robinson
(74) *Attorney, Agent, or Firm* — Cantor Colburn LLP

(57) ABSTRACT

New Te-salts are provided, including photoactive tellurium salt compounds useful for Extreme Ultraviolet Lithography.

20 Claims, No Drawings

SALTS AND PHOTORESISTS COMPRISING SAME

CROSS-REFERENCE TO RELATED APPLICATION

This Application claims the benefit of U.S. Provisional Application 62/593,229 filed on Nov. 30, 2017, which is incorporated herein by reference in its entirety.

FIELD

The present invention relates to new salt compounds that comprise one or more Te atoms. In one preferred aspect, photoactive tellurium salt compounds are provided that are useful for extreme ultraviolet lithography.

BACKGROUND

Extreme ultraviolet lithography ("EUVL") is one of the leading technologies options to replace optical lithography for volume semiconductor manufacturing at feature sizes<20 nm. The extremely short wavelength (13.4 nm) is a key enabling factor for high resolution required at multiple technology generations. In addition, the overall system concept—scanning exposure, projection optics, mask format, and resist technology—is quite similar to that used for current optical technologies. Like previous lithography generations, EUVL consists of resist technology, exposure tool technology, and mask technology. The key challenges are EUV source power and throughput. Any improvement in EUV power source will directly impact the currently strict resist sensitivity specification. Indeed, a major issue in EUVL imaging is resist sensitivity, the lower the sensitivity, the greater the source power that is needed or the longer the exposure time that is required to fully expose the resist. The lower the power levels, the more noise affects the line edge roughness (LER) of the printed lines.

Various attempts have been made to alter the make-up of EUV photoresist compositions to improve performance of functional properties. Among other things, a variety of photoactive compounds have been reported. See U.S. Pat. Nos. 8,039,194 and 8,652,712. See also US20150021289; US20150177613; and Fukunaga et al., *J. Photo Polymer Sci.*, 2017, 30(1), 103-3-107.

Electronic device manufacturers continually seek increased resolution of a patterned photoresist image. It would be desirable to have new photoresist compositions that could provide enhanced imaging capabilities, including new photoresist compositions useful for EUVL.

SUMMARY

We now provide new salts and photoresists that comprise such salts. In preferred aspects, the salts can function as an acid generator, including a photoacid generator, and can be particularly useful for extreme ultraviolet lithography applications.

Preferred salts include organic salt compounds that comprise one or more Te atoms.

More particularly, in a first embodiment, the present acid salts comprise an anion component that comprises one or more tellurium (Te) atoms.

In one aspect, preferred salts include those that comprise an anion component that contains one or more divalent Te atoms.

In another aspect, preferred salts include those that comprise an anion component that contains one or more tetravalent Te atoms.

In a yet further aspect, preferred salts include those that comprise an anion component that contains 1) one or more divalent Te atoms and 2) one or more tetravalent Te atoms.

In a more particular aspect, preferred salts comprise one or more divalent Te atoms include those of the following Formula (I):

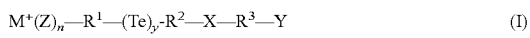

$$M^+(Z)_n\text{—}R^1\text{—}(Te)_y\text{-}R^2\text{—}X\text{—}R^3\text{—}Y \quad (I)$$

wherein $R^1$ is a non-hydrogen substituent such as $C_6$-$C_{30}$ aryl, $C_6$-$C_{30}$ heteroaryl, $C_1$-$C_{30}$ alkyl, heteroatom-containing $C_1$-$C_{30}$ alkyl and fluoro$C_1$-$C_{30}$ alkyl, each of which may be substituted or unsubstituted;

$R^2$ is a chemical bond or a non-hydrogen substituent such as $C_6$-$C_{30}$ aryl, $C_6$-$C_{30}$ heteroaryl, $C_1$-$C_{30}$ alkyl and heteroatom-containing $C_1$-$C_{30}$ alkyl, each of which may be substituted or unsubstituted; and optionally $R^2$ and $R^1$ can be linked together to form a single, multiple or fused ring structure typically having 5 to about 20 ring members;

X is a chemical bond or a divalent linking group;

$R^3$ is a linker such as a $C_1$-$C_{10}$ divalent linear or branched alky chain which can be fluorinated;

Z is absent or a substituent selected from single atom, a polar group such as hydroxyl group, $C_6$-$C_{30}$ aryl, $C_6$-$C_{30}$ heteroaryl, $C_1$-$C_{30}$ alkyl and heteroatom-containing $C_1$-$C_{30}$ alkyl. Z can optionally comprise an acid cleavable group or a polymerizable group;

Y is an anionic group (can comprise a negative charge) such as carboxylate, sulfonate, sulfamate, an anion of a sulfonamide, or an anion of a sulfonimide, or hydroxide (e.g. $SO_3^-$, $COO^-$, $NHSO3^-$ or $HO^-$).

n is an integer equal or greater than 0; and y is an integer equal or greater than 1; and $M^+$ is a cation component.

Preferred salts comprise one or more tetravalent Te atoms include those of the following Formula (II):

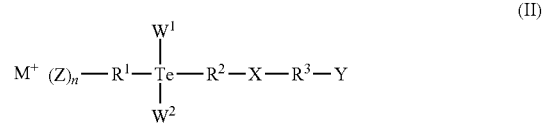

$$M^+ (Z)_n\text{—}R^1\text{—}\underset{W^2}{\overset{W^1}{Te}}\text{—}R^2\text{—}X\text{—}R^3\text{—}Y \quad (II)$$

wherein $W^1$ and $W^2$ are each the same or different non-hydrogen substituents such as a halogen, optionally substituted $C_1$-$C_{10}$ alkylsulfonate ($RSO_3$ where R is optionally substituted $C_{1-10}$alkyl), optionally substituted $C_1$-$C_{10}$ fluoroalkylsulfonate ($R_fSO_3$ where $R_f$ is optionally substituted $C_{1-10}$alkyl having one or more F atoms), optionally substituted $C_1$-$C_{10}$ fluoroalkylcarboxylate ($R_fCO_2$ where $R_f$ is optionally substituted $C_{1-10}$alkyl having one or more F atoms), optionally substituted $C_1$-$C_{10}$ alkylcarboxylate ($RCO_2$) where R is optionally $C_{1-10}$alkyl);

$R^1$, $R^2$, $R^3$, X, Y, Z and n are the same as defined in Formula (I) above; and $M^+$ is a cation component.

In compounds of the invention (including a compound of the above Formulae (I) and (II)) the cation $M^+$ suitably can be an inorganic or organic group that may contain one or more cation groups (e.g. $I^+$, $S^+$, $Se^+$, $Te^+$) and more typically is an organic group. Suitable organic compounds may include aromatic and non-aromatic groups, including phe nyl-containing anions and aliphatic anions such as $C_{1-30}$ alkyl groups which may suitably contain one or more cation groups (e.g. $I^+$, $S^+$, $Se^+$, $Te^+$).

In certain preferred aspects, the cation component $M^+$ in Formulae (I) or (II) corresponds to the formula $(R^5)M^+(R^6)(R^7_r)$ where $R^5$, $R^6$ and $R^7$ are the same or different non-hydrogen substituents such as $C_6$-$C_{30}$ aryl, $C_6$-$C_{30}$ heteroaryl, $C_1$-$C_{30}$ alkyl, heteroatom-containing $C_1$-$C_{30}$ alkyl and fluoro$C_1$-$C_{30}$ alkyl, each of which may be substituted or unsubstituted, and optionally two of $R^5$, $R^6$ and $R^7$ may be taken together to form a ring; r is 0 or 1; and M+ is S, Se, Te or I. In certain preferred aspects, in that formula, when r=1, M is S, Se or Te and when r=0, M is I.

In certain preferred aspects, a salt of the invention may be covalently linked to a polymer, for example one of either an anion or cation component of an acid generator may be covalently linked to a polymer, or each of the anion and cation components of the salt may be covalently linked to a polymer.

In certain preferred aspects, a salt of the present invention may comprise a polymerizable group such as an unsaturated group, for example a carbon-carbon unsaturated group, including activated vinyl groups such as an acrylate moiety. Such polymerizable groups can be reacted to covalently link a salt (e.g. used as an acid generator) to other composition components such as a resist resin.

Preferred photoresists of the invention may comprise an imaging-effective amount of one or more salts as disclosed herein and a suitable polymer component. The one or more salts suitably may function as an acid generator component in a photoresist composition. In this embodiment, a resist may comprise a mixture of distinct salt compounds, typically a mixture of 2 or 3 different salt compounds, more typically a mixture that consists of a total of 2 distinct salt compounds.

Te-salts as disclosed herein also may be employed as a photodecomposable quencher (PDQ) such as in a photoresist composition together with another distinct acid generator that generates a stronger acid upon photoactivation that the Te-containing PDQ.

For use as a PDQ, a Te-salt may have an anion component having a relatively high pKa (e.g. sulfamate having pKa greater than 0 or carboxylate having pKa greater than 3). As referred to herein, pKa values are in aqueous solution at 23° C. and can be measured experimentally or calculated, for example using Advanced Chemistry Development (ACD) Labs Software Version 11.02.

Preferred salts of the invention used as a PDQ generate weaker acids than produced by a distinct photoacid generator compound present in the same or adjoining composition such as the same photoresist composition. Thus, without being bound by theory, as the strong acid generated by the distinct photoacid generator in an exposed photoresist region migrates to unexposed photoresist areas, the photo-destroyable quencher with higher pKa in the unexposed region quenches the strong acid diffused from exposed region. This can result in neutralization of strong acid in the unexposed region and thereby improve lithographic results.

Thus, in certain preferred aspects, an acidic component of a Te-containing PDQ of a resist composition will differ in pKa by 0.5, 1, 2, 3 or 4 or more from the acidic component of a distinct photoacid generator compound present in the same photoresist composition.

Methods are also provided for forming relief images of photoresist compositions of the invention (including patterned lines with sub sub-50 nm or sub-20 nm dimensions). Such methods may comprise, for example: a) applying a coating layer of a photoresist of the invention on a substrate; b) exposing the photoresist composition layer to activating radiation including EUV; and c) developing the exposed photoresist composition coating layer.

Substrates such as a microelectronic wafer also are provided having coated thereon a photoresist composition of the invention. Electronic devices formed by the disclosed methods are also provided, Other aspects of the invention are discussed infra.

DETAILED DESCRIPTION

As referred to herein, acid generator compounds can produce an acid when exposed to activating radiation, such as EUV radiation, e-beam radiation or other radiation sources such as 193 nm wavelength radiation. Acid generator compounds as referred to herein also may be referred to as photoacid generator compounds.

The term Te-salt refers to a salt compound as disclosed herein that comprises one or more Te atoms.

As also discussed, preferred Te-salts may be photoactive and reactive to photolithography radiation such as 193 nm and EUV radiation. One or more of such preferred Te-salts can be used as a photoactive component of a photoresist. However, the invention also includes in other aspects Te-salts that may not be photoactive including with respect to such radiation, or may not be used at least directly or otherwise as a photoactive resist component.

Preferred Te-salts compounds include those of Formulae (I) and (II) as defined above.

In those above Formulae (I) and (II), suitable non-hydrogen substituents may be e.g. halo (F, Cl, Br or I); cyano, nitro, hydroxy, optionally substituted C1-20alkyl, optionally substituted C1-20alkoxy, such as optionally substituted alkyl (e.g. optionally substituted C1-10 alkyl), optionally substituted alkenyl or alkynyl preferably having 2 to about 20 carbon atoms such as such as allyl; optionally substituted ketones preferably having 1 to about 20 carbon atoms; optionally substituted alkylthio preferably having 1 to about 20 carbon atoms; optionally substituted alkylsulfinyl preferably 1 to about 20 carbon atoms; optionally substituted alkylsulfonyl preferably having 1 to about 20 carbon atoms; optionally substituted carboxy preferably have 1 to about 20 carbon atoms (which includes groups such as —COOR' where R' is H or $C_{1-8}$ alkyl, including esters that are substantially non-reactive with photoacid); optionally substituted alkaryl such as optionally substituted benzyl, optionally substituted carbocyclic aryl such as optionally substituted phenyl, naphthyl, acenaphthyl, or optionally substituted heteroalicyclic or heteroaromatic group such as pyridyl, furanyl, pyrrole, thiophene, furan, imidazole, pyrazole, oxazole, isoxazole, thiazole, isothiazole, triazole, furanzan, oxadiazole, thiadiazole, dithiazole, terazole, pyran, thiopyran, diazine, oxazine, thiazine, dioxine, dithine, and triazine and polyaromatic groups containing one or more of such moieties.

As discussed, Te-salts of the above formulae may be suitably substituted at available positions by one or more acid-labile groups. Suitable acid-labile groups may be a variety of moieties, including acid-labile esters and acetals such as optionally substituted ethylcyclopentyl ester, methyladamantyl ester, ethyl adamantyl ester, t-butylester, phenyl ester, naphthyl ester and ethoxy ethyl ethers and esters and others. In certain preferred aspects, a Te-salt of the invention will contain 1 or 2 covalently linked acid-labile groups. As referred to herein, acid-labile moieties or groups (including acid-labile esters and acetals) undergo reaction in the presence of generated acid (from an acid generator compound in a resist) during typical lithographic processing, including any post-radiation exposure thermal exposure. Acid-labile groups as referred to herein also may be referred to as photoacid-labile groups.

The present Te-salts can be readily prepared. See, for instance, the syntheses set forth in the examples, which follow.

Suitable Te-salts anion components that comprise one or more divalent tellurium atoms include the following:

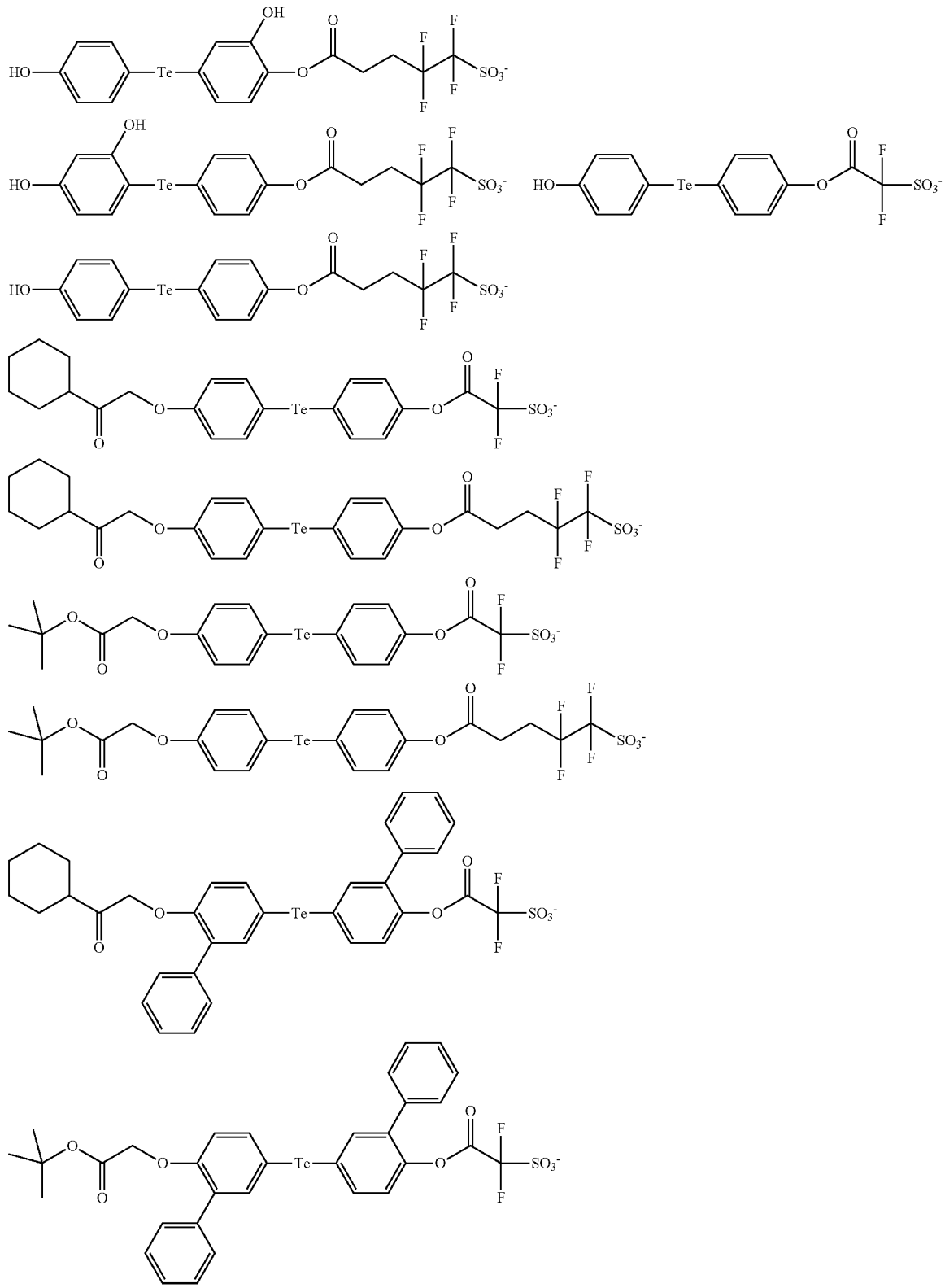

-continued
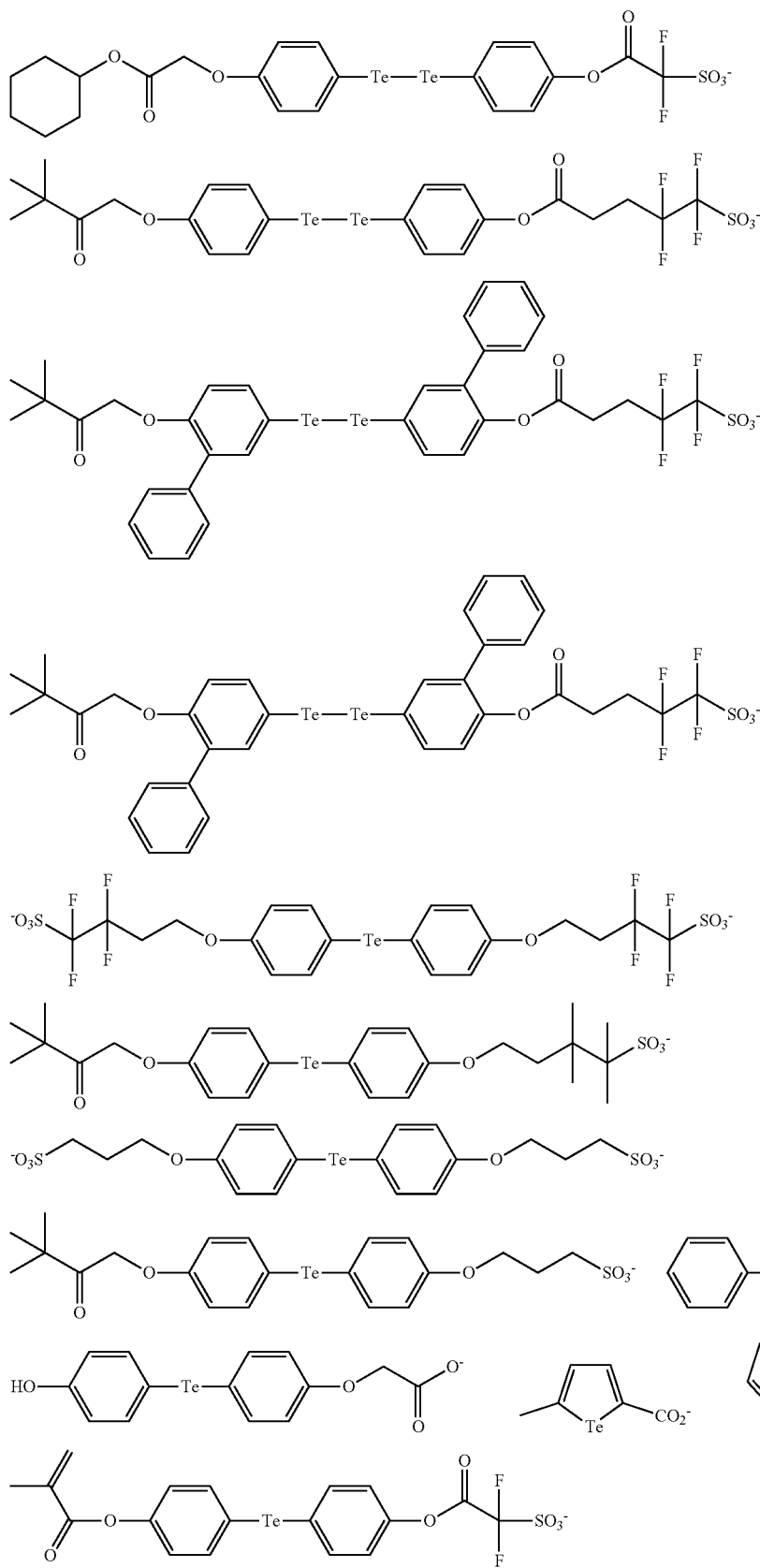

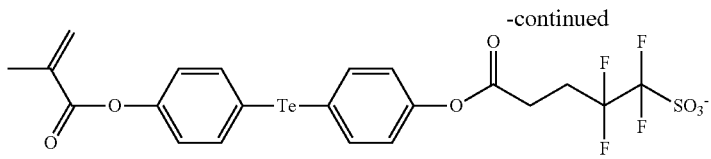

Suitable Te-salt anion components that one or more tetravalent tellurium atoms include the following:

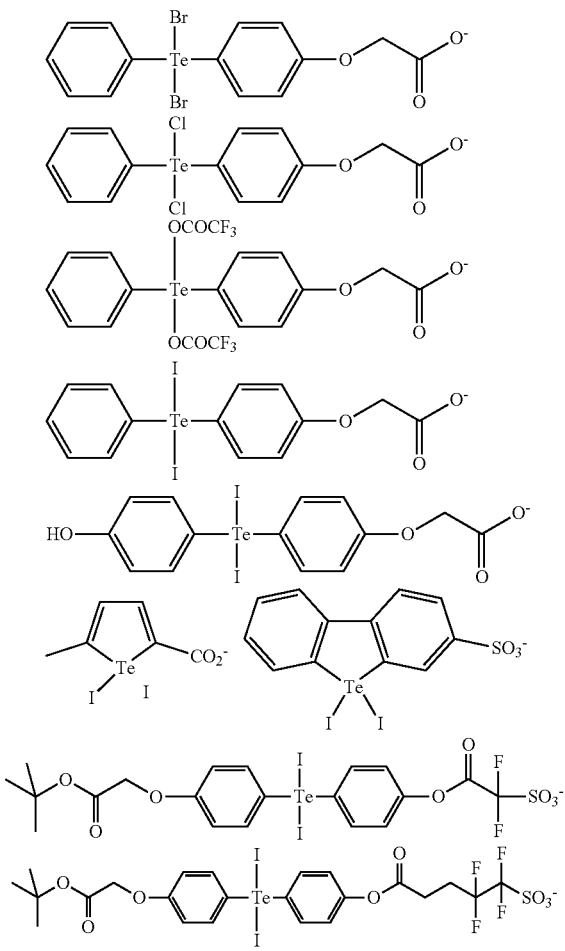

Photoresist Compositions

As discussed above, Te-salts as disclosed herein are useful as the radiation sensitive component in photoresist compositions, including both positive-acting and negative-acting chemically amplified resist compositions.

The photoresists of the invention typically comprise a polymer and one or more Te-salts as disclosed herein. Preferably the polymer has functional groups that impart alkaline aqueous developability to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Te-salts of the invention are also suitably used with polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups. For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic group(s) such as optionally phenyl, e.g. a styrene or vinyl phenol monomer.

Preferred monomers used for the formation of such polymers include: an acid-labile monomer having the below formula (V), a lactone-containing monomer of the formula (VI), a base-soluble monomer of formula (VII) for adjusting dissolution rate in alkaline developer, and a photoacid-generating monomer of the formula (VIII), or a combination comprising at least one of the foregoing monomers:

(V)

(VI)

(VII)

(VIII)

wherein each $R^a$ is independently H, F, —CN, $C_{1-10}$ alkyl, or $C_{1-10}$ fluoroalkyl. In the acid-deprotectable monomer of formula (V), $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the photoacid generating monomer of formula (VIII), Q is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non-ester-containing and fluorinated or non-fluorinated, and is $C_{1-20}$ alkyl, $C_{3-20}$ cycloalkyl, $C_{6-20}$ aryl, or $C_{7-20}$ aralkyl, $Z^-$ is an anionic moiety comprising carboxylate, sulfonate, an anion of a sulfonamide, or an anion of a sulfonimide, and $G^+$ is a sulfonium or iodonium cation.

Exemplary acid-labile monomers include but are not limited to:

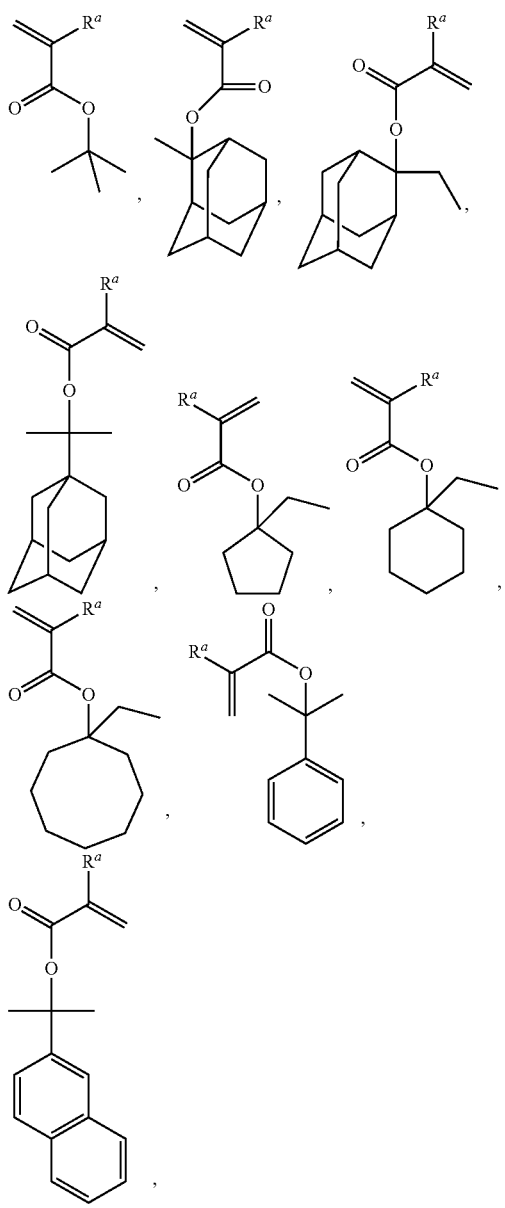

or a combination comprising at least one of the foregoing, wherein $R^a$ is H, F, —CN, $C_{1-6}$ alkyl, or $C_{1-6}$ fluoroalkyl.

Suitable lactone monomers may be of the following formula (IX):

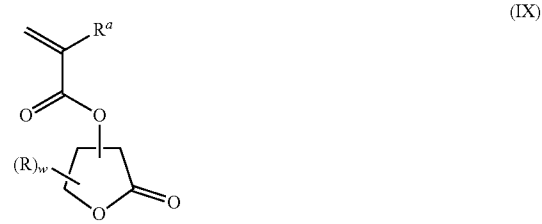

(IX)

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 5. In formula (IX), R is attached directly to the lactone ring or commonly attached to the lactone ring and/or one or more R groups, and the ester moiety is attached to the lactone ring directly, or indirectly through R.

Exemplary lactone-containing monomers include:

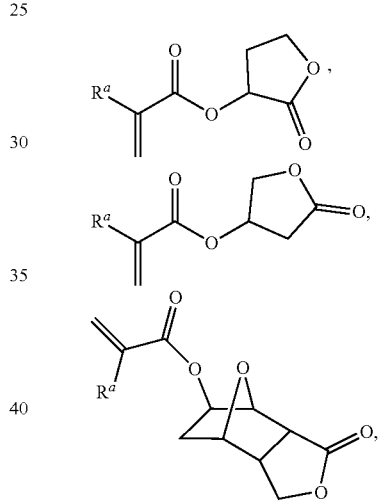

or a combination comprising at least one of the foregoing monomers, wherein $R^a$ is H, F, —CN, $C_{1-10}$ alkyl, or $C_{1-10}$ fluoroalkyl.

Suitable base-soluble monomers may be of the following formula (X):

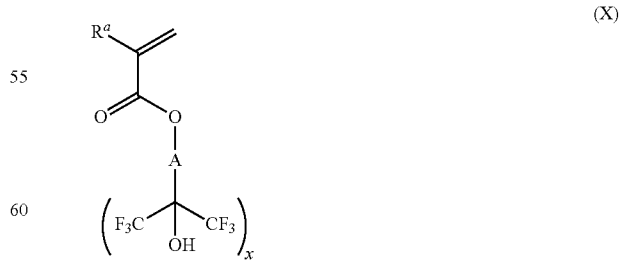

(X)

wherein each $R^a$ is independently H, F, —CN, $C_{1-10}$ alkyl, or $C_{1-10}$ fluoroalkyl, A is a hydroxyl-containing or non-hydroxyl containing, ester-containing or non ester-containing, fluorinated or non-fluorinated $C_{1-20}$ alkylene, $C_{3-20}$ cycloalkylene, C$_{6-20}$ arylene, or C$_{7-20}$ aralkylene, and x is an integer of from 0 to 4, wherein when x is 0, A is a hydroxyl-containing C$_{6-20}$ arylene.

Exemplary base soluble monomers include those having the following structures:

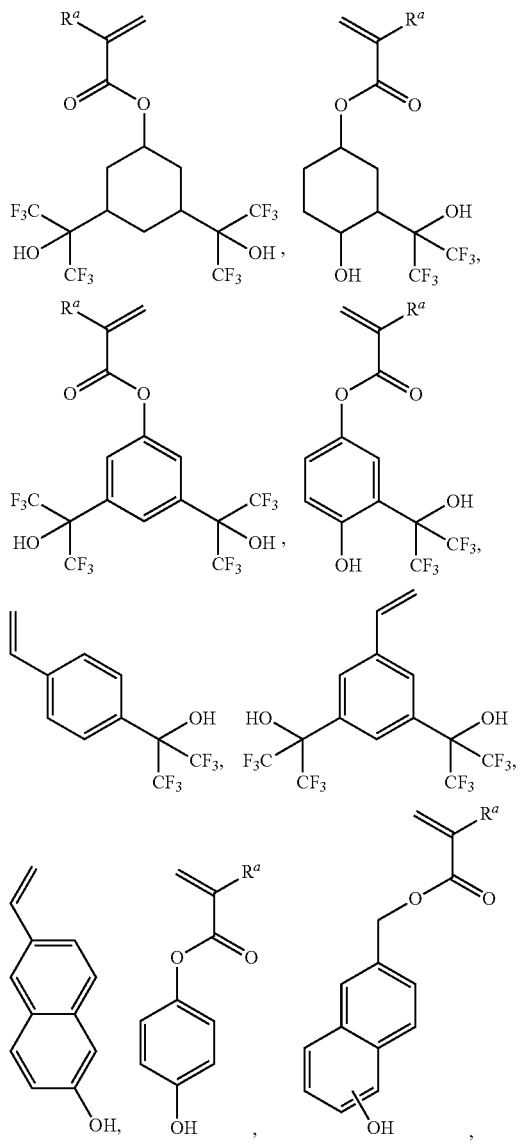

or a combination comprising at least one of the foregoing, wherein R$^a$ is H, F, —CN, C$_{1-6}$ alkyl, or C$_{1-6}$ fluoroalkyl.

Preferred photoacid generating monomer include those of the formulae (XI) or (XII):

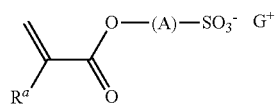

(XI)

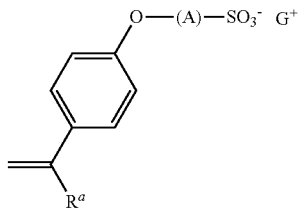

(XII)

wherein each R$^a$ is independently H, F, —CN, C$_{1-6}$ alkyl, or C$_{1-6}$ fluoroalkyl, A is a fluorine-substituted C$_{1-30}$ alkylene group, a fluorine-substituted C$_{3-30}$ cycloalkylene group, a fluorine-substituted C$_{6-30}$ arylene group, or a fluorine-substituted C$_{7-30}$ alkylene-arylene group, and G$^+$ is a sulfonium or iodonium cation.

Preferably, in formulas (XI) and (XII), A is a —[(C(R$^1$)$_2$)$_x$C(=O)O]$_b$—C((R$^2$)$_2$)$_y$(CF$_2$)$_z$— group, or an o-, m- or p-substituted —C$_6$F$_4$— group, where each R$^1$ and R$^2$ are each independently H, F, —CN, C$_{1-6}$ fluoroalkyl, or C$_{1-6}$ alkyl, b is 0 or 1, x is an integer of 1 to 10, y and z are independently integers of from 0 to 10, and the sum of y+z is at least 1.

Exemplary preferred photoacid generating monomers include:

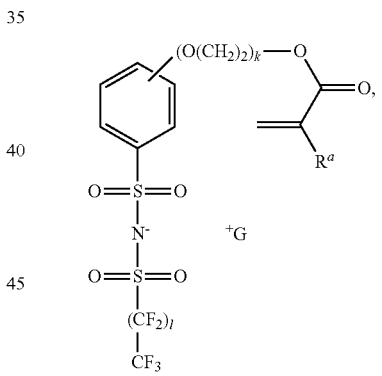

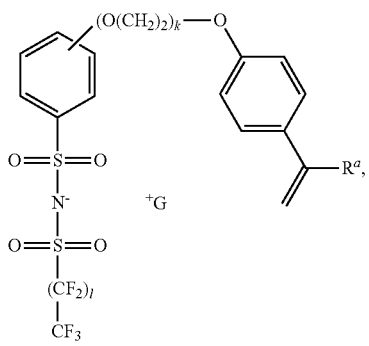

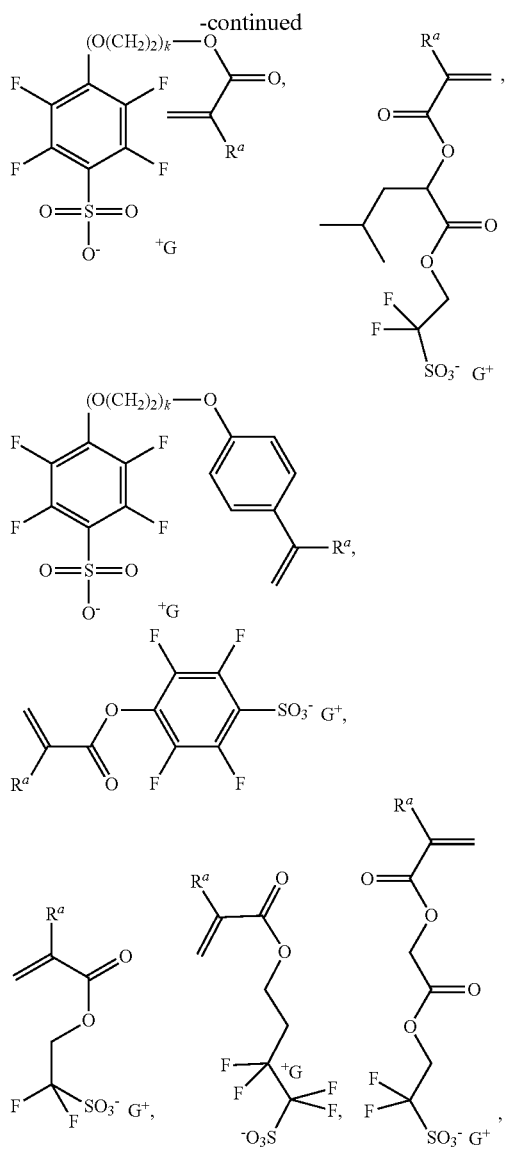
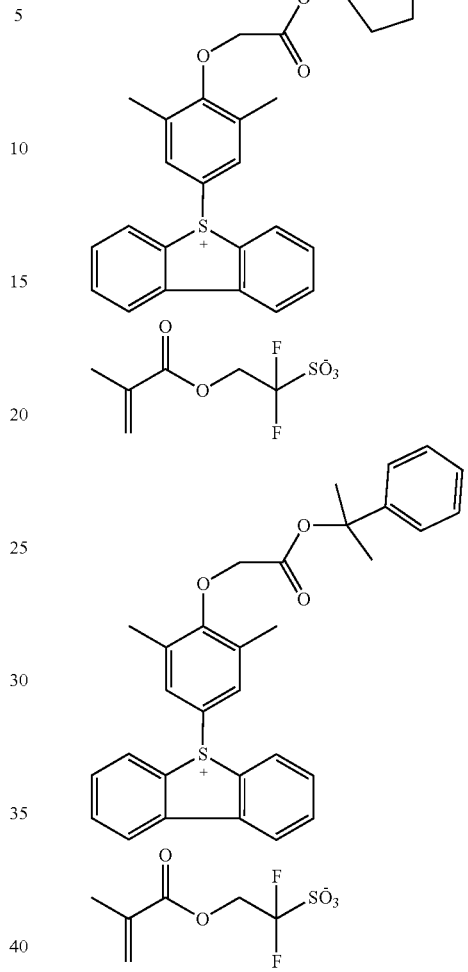

or a combination comprising at least one of the foregoing, where each $R^a$ is independently H, F, —CN, $C_{1-6}$ alkyl, or $C_{1-6}$ fluoroalkyl, k is suitably an integer of from 0 to 5; and $G^+$ is a sulfonium or iodonium cation.

Preferred photoacid-generating monomers may include sulfonium or iodonium cation. Preferably, in formula (IV), $G^+$ is of the formula (XIII):

(XIII)

wherein X is S or I, each $R^0$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^0$ groups is optionally attached to one adjacent $R^0$ group by a single bond, and a is 2 or 3, wherein when X is I, a is 2, or when X is S, a is 3.

Exemplary acid generating monomers include those having the formulas:

wherein $R^a$ is H, F, —CN, $C_{1-6}$ alkyl, or $C_{1-6}$ fluoroalkyl.

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Polymers for use in photoresists of the invention may suitably vary widely in molecular weight and polydispersity. Suitable polymers include those that have a $M_w$ of from about 1,000 to about 50,000, more typically about 2,000 to about 30,000 with a molecular weight distribution of about 3 or less, more typically a molecular weight distribution of about 2 or less.

Photoresists of the invention also may contain other materials. For example, other optional additives include actinic and contrast dyes, anti-striation agents, plasticizers, speed enhancers, sensitizers, photodestroyable bases etc. Such optional additives typically will be present in minor concentration in a photoresist composition.

Inclusion of base materials, preferably the carboxylate or sulfonate salts of photo-decomposable cations, provides a mechanism for neutralization of acid from the acid decomposable groups, and limits the diffusion of the photogenerated acid, to thereby provide improved contrast in the photoresist.

Photo-destroyable bases include photo-decomposable cations, and preferably those also useful for preparing acid generator compounds, paired with an anion of a weak (pKa>2) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, 1,1',1"-nitrilotripropan-2-ol, 1,1',1",1'"-(ethane-1,2-diylbis(azanetriyl))tetrapropan-2-ol; aryl amines such as diphenylamine, triphenylamine, aminophenol, and 2-(4-aminophenyl)-2-(4-hydroxyphenyl)propane, Troger's base, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Such photoresists may include the copolymer in an amount of 50 to 99 wt %, specifically 55 to 95 wt %, more specifically 60 to 90 wt %, and still more specifically 65 to 90 based on the total weight of solids. A photo-destroyable base if utilized may be present in the photoresist in an amount of 0.01 to 5 wt %, specifically 0.1 to 4 wt %, and still more specifically 0.2 to 3 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 30 wt %, based on the total weight of solids and solvent. If used as a photoacid generator, Te-salt compound(s) should be present in an amount sufficient to enable generation of a latent image in a coating layer of the resist. More specifically, the one or more Te-salt compounds will suitably be present in an amount of from about 1 to 50 weight percent of total solids of a resist. It will be understood that the solids includes copolymer, photo-destroyable base, quencher, surfactant, any added PAG, and any optional additives, exclusive of solvent.

A coated substrate may be formed from the photoresist containing acid generator compound(s) (which may be a Te-salt as disclose herein) which should be present in an amount sufficient to enable generation of a latent image in a coating layer of the resist. Such a coated substrate includes: (a) a substrate having one or more layers to be patterned on a surface thereof; and (b) a layer of the photoresist composition including the one or more Te-salts over the one or more layers to be patterned. For EUV or e beam imaging, photoresists may suitably have relatively higher content of Te-salt(s), e.g. where the one or more Te-salts which may function as acid generator compounds comprise 5 to 10 to about 65 weight percent of total solids of the resist. Typically, lesser amounts of the photoactive component will be suitable for chemically amplified resists.

The photoresists of the invention are generally prepared following known procedures with the exception that one or more Te-salt of the invention are included in the photoresist and in certain aspects are substituted for prior photoactive compounds used in the formulation of such photoresists. The photoresists of the invention can be used in accordance with known procedures.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying a layer of a photoresist composition including on a surface of the substrate; (b) patternwise exposing the photoresist composition layer to activating radiation; and (c) developing the exposed photoresist composition layer to provide a resist relief image.

Applying may be accomplished by any suitable method, including spin coating, spray coating, dip coating, doctor blading, or the like. Applying the layer of photoresist is preferably accomplished by spin-coating the photoresist in solvent using a coating track, in which the photoresist is dispensed on a spinning wafer. During dispense, the wafer may be spun at a speed of up to 4,000 rpm, preferably from about 500 to 3,000 rpm, and more preferably 1,000 to 2,500 rpm. The coated wafer is spun to remove solvent, and baked on a hot plate to remove residual solvent and free volume from the film to make it uniformly dense.

Patternwise exposure is then carried out using an exposure tool such as a stepper, in which the film is irradiated through a pattern mask and thereby is exposed pattern-wise. The method preferably uses advanced exposure tools generating activating radiation at wavelengths capable of high resolution including extreme-ultraviolet (EUV) or e-beam radiation. It will be appreciated that exposure using the activating radiation decomposes the PAG in the exposed areas and generates acid and decomposition by-products, and that the acid then effects a chemical change in the polymer (deblocking the acid sensitive group to generate a base-soluble group, or alternatively, catalyzing a cross-linking reaction in the exposed areas). The resolution of such exposure tools may be less than 30 nm.

Developing the exposed photoresist layer is then accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups, and the developer is preferably a metal-ion free tetraalkylammonium hydroxide solution, such as, for example, aqueous 0.26 N tetramethylammonium hydroxide. A pattern forms by developing.

Additionally, for positive resists, unexposed regions can be selectively removed by treatment with a suitable nonpolar solvent for negative tone development. See U.S. 2011/0294069 for suitable procedures for negative tone development of positive photoresists. Typical nonpolar solvents for negative tone development are organic developers, such as a solvent chosen from ketones, esters, hydrocarbons, and mixtures thereof, e.g. acetone, 2-hexanone, methyl acetate, butyl acetate, and terahydrofuran.

The photoresist may, when used in one or more such a pattern-forming processes, be used to fabricate electronic and optoelectronic devices such as memory devices, processor chips (CPU's), graphics chips, and other such devices.

The following examples are illustrative of the invention.

Example 1: Te-Salt Syntheses

Example 1A

The reaction steps for the synthesis of the Te-salt (photoacid generator) compound designated TPS DPTe-TFPS (8) is shown in Scheme 1. The synthesis of 4-(Phenyltelluro)phenol (5) is described by C. Prasad et al, Journal of Organic Chemistry, 78(4), 1434-1443; 2013. Salt 4 is prepared as follow: To a solution of 5-bromo-4,4,5,5-tetrafluoropentanoic acid (35 g) in 200 mL ethanol is added p-toluenesulfonic acid (0.3 g) and the mixture was heated at reflux for 6 hours. The mixture is cooled to room temperature and the solvent is removed to completion to produce 5-bromo-4,4,5,5-tetrafluoropentanoic acid ethylester (2), which is used in the next step without further purification. To a solution of compound 2 in 150 mL acetonitrile is added a solution made of 48.0 g sodium dithionate, 34.0 g sodium hydrogen carbonate and 150 mL water. The resulting mixture is stirred at 70° C. for 16 hours and then cooled to room temperature. Upon standing, the mixture is separated into two phases, an aqueous phase and an organic (acetonitrile) phase. The organic phase is separated, mixed with 20 g of 30% aqueous solution of hydrogen peroxide and the mixture is stirred at room temperature for 48 hours. Excess hydrogen peroxide is neutralized by the addition of sodium sulfite. Then the solvent acetonitrile is removed under reduced pressure to produce salt 3. To a solution of salt 3 in 100 ml water is added 5 g of sodium hydroxide and the mixture refluxed for 4 hours, cooled to room temperature and acidified with aqueous solution of 1N HCl until pH=2. The water is completely removed under reduced pressure. The resulting residue is suspended in acetonitrile, filtered to remove inorganics and the acetonitrile is fully removed under reduced pressure to produce the final product 4 (yield: 13.5 g). To a solution of salt 4 (5.0 g, 16.8 mmol) in 50 mL acetonitrile is added 2.93 g (18.1 mmol) 1,1'-Carbonyldiimidazole (CDI). The mixture is stirred at room temperature for 1 hour. 4-(phenyltelluro)phenol (5.40 g, 18.13 mmol) is added in one portion. The mixture is stirred at 70° C. for 6 hours, cooled to room temperature and filtered to remove insoluble salts. The filtrate is concentrated to produce crude salt 6. Salt 6 and triphenysulfonium bromide (6.20 g, 18.10) are mixed with 100 mL dichloromethane and 100 mL water and the mixture is stirred at room temperature for 16 hours. The organic phase is separated and is washed twice with 100 mL of deionized water. The solvent from the organic phase is completely removed under reduced to produce Te-salt (photoacid generator) compound TPS DPTe-TFPS (8).

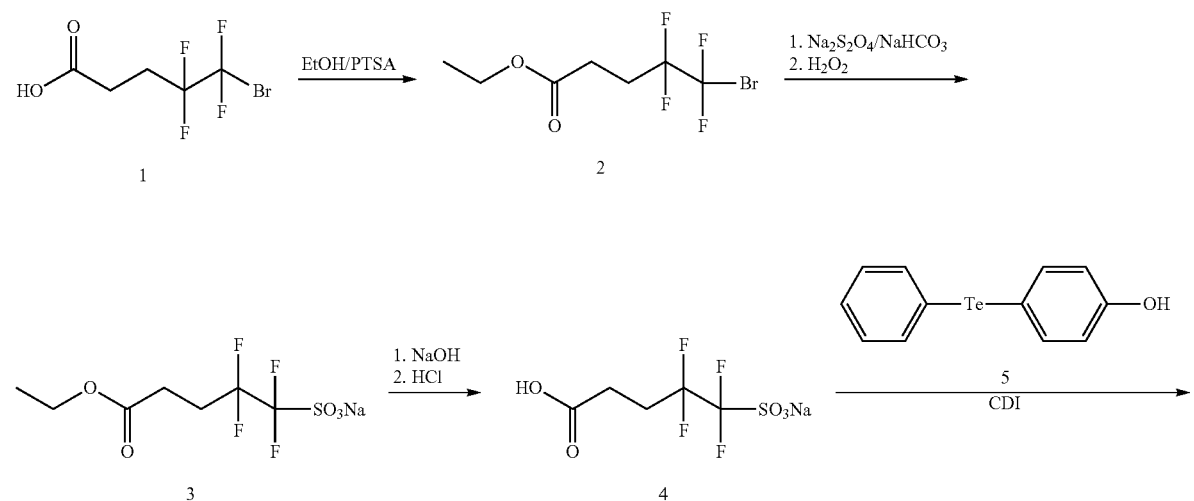

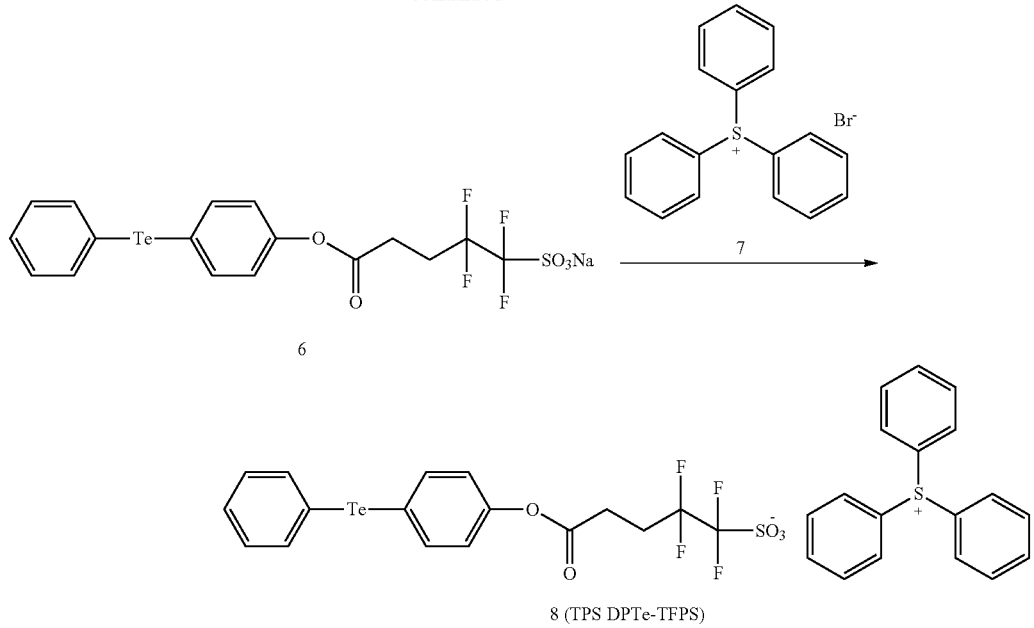

Example 1B

The reactions steps for the synthesis of Te-salt (photoacid generator compound) designated TPS TBPTeP-TFBS (13) is shown in Scheme 2 below. The synthesis of bis(4-hydroxyphenyl) telluride (9) is described by S. Zhang et al, Tetrahedron Letters, 54(20), 2452-2454; 2013. To a solution of compound 9 (10.0 g, 31.80 mmol) in 75 mL N,N-dimethylforamide is added chloroacetic acid tert-butyl ester (4.80 g, 3.90 mmol) and 4.40 g of potassium carbonate. The mixture is stirred under inert atmosphere at 80° C. for 6 hours, cooled to room temperature and poured into 150 mL of water to produce a residue the comprises a mixture of the desired product 11 and other organic component. Product 11 is separated from other components by column chromatography.

To a solution of salt 4 (2.50 g, 8.4 mmol) in 50 mL acetonitrile is added 1.47 g (9.0 mmol) 1,1'-carbonyldiimidazole (CDI). The mixture is stirred at room temperature for 1 hour and then compound 11 (3.80 g, 9.05 mmol) is added in one portion. The mixture is stirred at 70° C. for 6 hours, cooled to room temperature and filtered to remove insoluble salts. The filtrate is concentrated to produce crude salt 12. Salt 12 and triphenysulfonium bromide (3.09 g, 9.0) are mixed with 100 mL dichloromethane and 100 mL water and the mixture is stirred at room temperature for 16 hours. The organic phase is separated and washed twice with 100 mL of deionized water. The solvent from the organic phase is completely removed under reduced to produce Te-salt (photoacid generator compound) TPS TBPTeP-TFBS (13).

Scheme 2

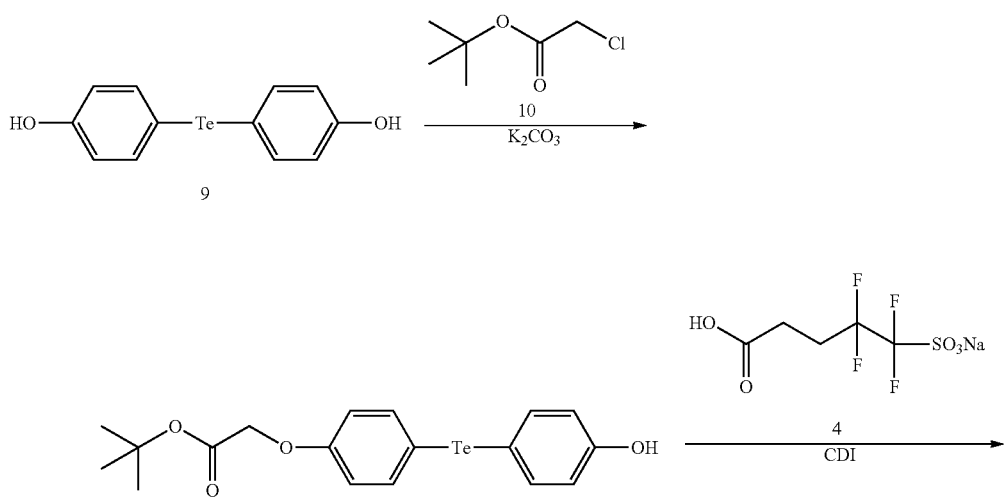

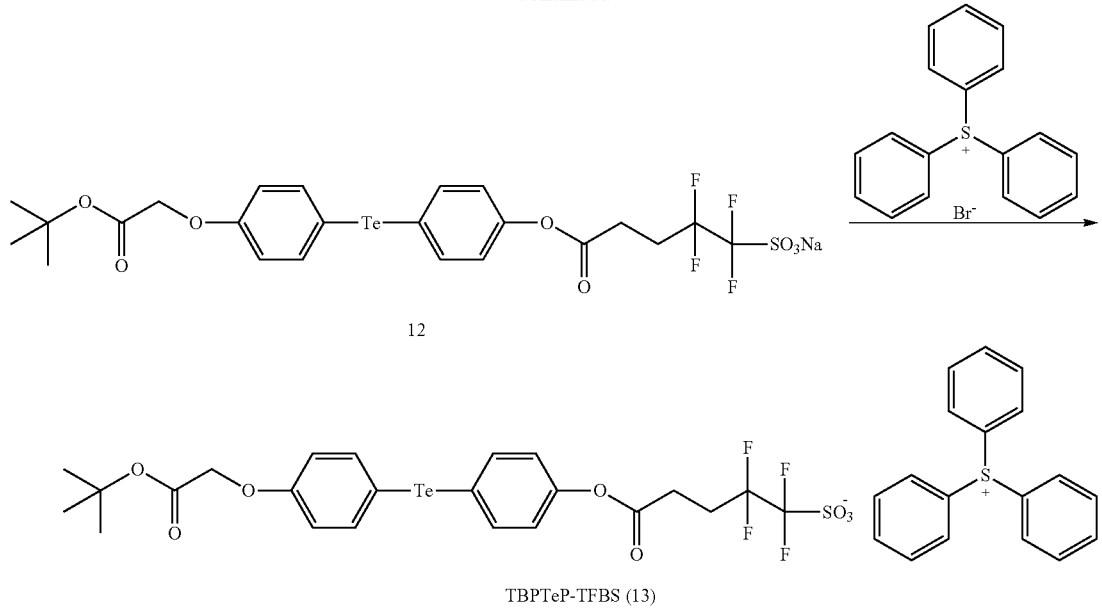

TBPTeP-TFBS (13)

Example 1C

The reactions steps for the synthesis of Te-salt (photoacid generator compound) designated TPS HPTePAc (16) is shown in Scheme 3 below. The synthesis of compound 11 is described in Example 1B above. To a solution of 10 g of compound 11 (23.4 mmol) in 100 mL dichloromethane is added and is treated with 10 mL 4M solution HCl in dioxane. The mixture is stirred at room temperature for 16 hours. The solvent is removed from the reaction mixture to produce compound 14. A suspension of compound 14 in 50 mL water and 50 mL methanol was treated with 1N aqueous solution of sodium hydroxide until pH=11 to generate an aqueous solution of salt 15. Triphenysulfonium bromide (8.0 g, 23.3 mmol) is added to the solution of 15 and the mixture is stirred at room temperature for 16 hours. The solvents are removed completly under reduced pressure to produce crude photoactive compound TPS HPTePAc (16). Purification of 16 is achieved via passing thorough silica-gel column.

Scheme 3:

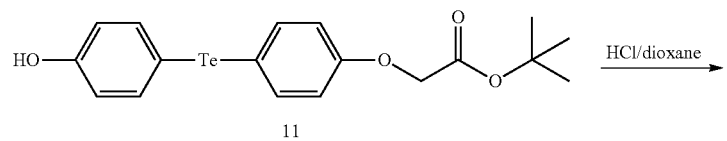

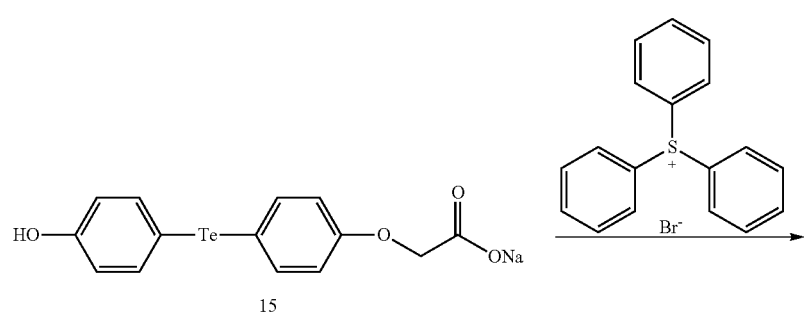

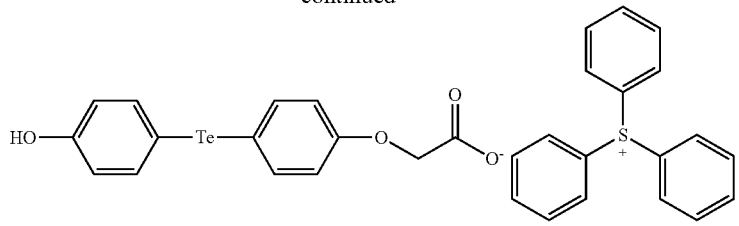

TPS HPTePAc (16)

Example 1D

The synthesis of Te-salt (photoacid generator compound) designated TPS DPDITe-TFPS (16) is shown in Scheme 4 below. A solution of iodine (2.0 g, 7.9 mmol) in diethylether (10 mL) is added with stirring to a solution of compound 8 (6.3 g; 7.9 mmol) in ethanol (25 mL). The product is isolated and dried.

Scheme 4

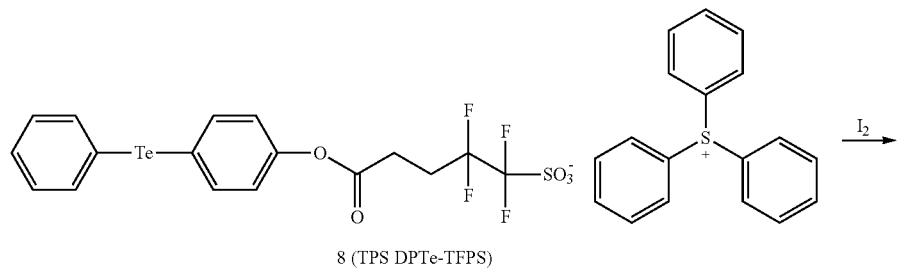

8 (TPS DPTe-TFPS)

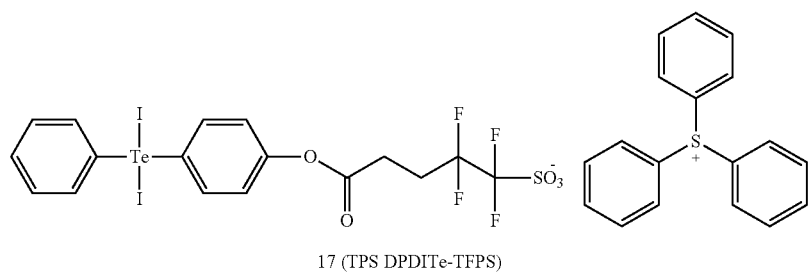

17 (TPS DPDITe-TFPS)

Example 1E

The synthesis of Te-salt (photoactive compound) designated BTPS DPTe-BTPrS (19) is shown in Scheme 5 below. The synthesis of the salt 18 is described by Kanda T. et al in J. Org. Chem. 1999, 64, 8161-8169. A solution made of salt 18 (1.0 g, 1.66 mmol) and triphenylsulfonium bromide (1.14 g, 3.32 mmol) in a mixture of 30 mL dichloromethane and 30 mL water is stirred at room temperature for 16 hours. The organic phase is separated, washed five times with 25 mL of deionized water, concentrated and poured into heptane to obtain compound BTPS DPTe-BTPrS (19).

Scheme 5

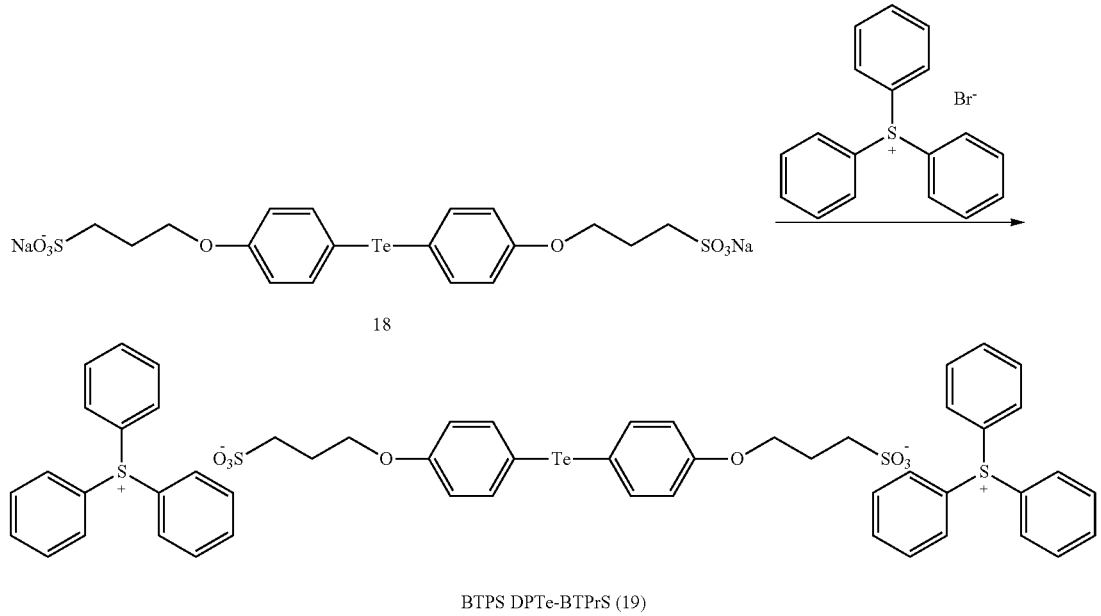

BTPS DPTe-BTPrS (19)

Example 1F

The synthesis of Te-salt (photoactive compound) designated BTPS DPTe-BTFBS (22) is shown in Scheme 6 below. The synthesis of compound 20 is described in U.S. Patent Application Publication No. US20120172555A1 of Coley, et al. Similar procedure for the preparation of 18 is used for the preparation of salt 21. A solution made of salt 21 (1.0 g, 1.29 mmol) and triphenylsulfonium bromide (0.88 g, 2.58 mmol) in a mixture of 15 mL dichloromethane and 15 mL water is stirred at room temperature for 16 hours. The organic phase is separated, washed five times with 20 mL of deionized water, concentrated and poured into heptane to obtain compound BTPS DPTe-BTFB (22).

Scheme 6

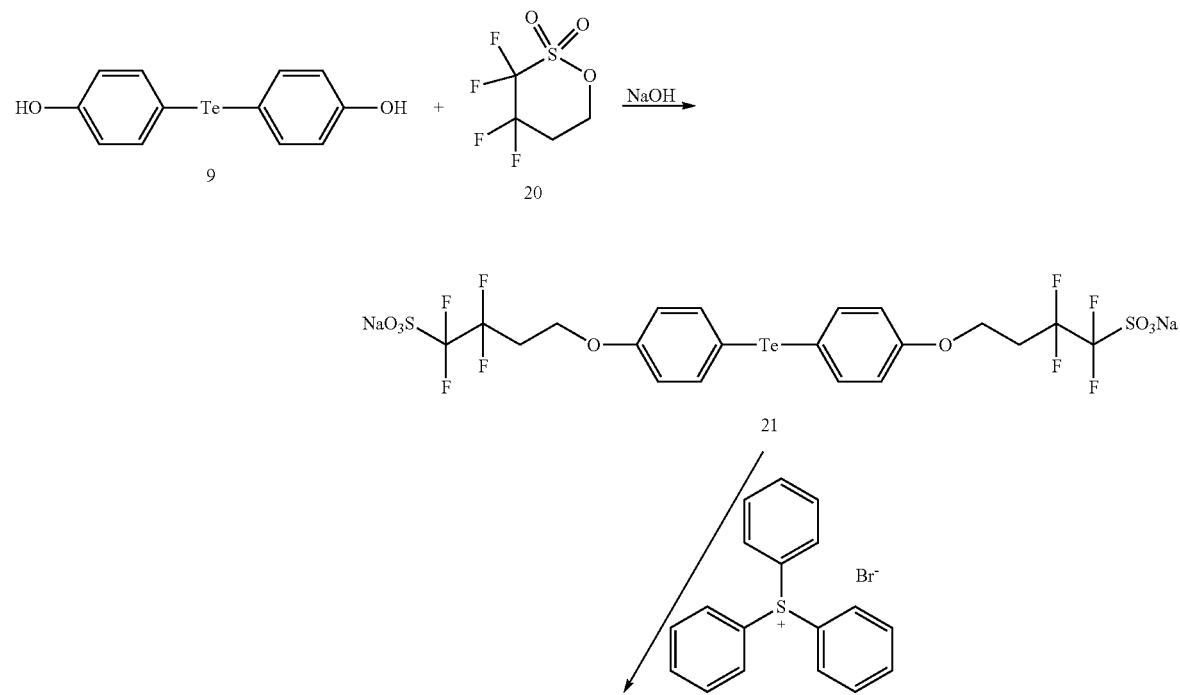

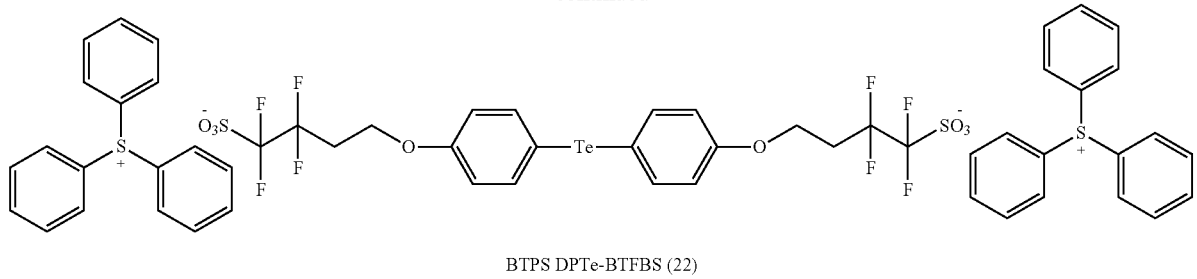

BTPS DPTe-BTFBS (22)

Example 2: EUV Transmission Calculations

The effect of using new salts on film absorption at EUV radiation is exemplified by the transmission calculation data. The transmissions at EUV exposure (13.5 nm) for films made from composition examples were calculated from the Center for X-Ray Optics at Lawrence Berkeley National Laboratory web site by inputting the calculated composition molecular formula and assuming film density of 1.20 g/cm$^3$ and film thickness of 60 nm.

The calculated % transmissions for films made of each of the PAG compounds TPS Tf, TPS DPTe-TFPS and TPS DPDITe-TFPS (shown in FIG. 2) were calculated for 60 nm film thickness, assuming film density of 1 g/cm$^3$. The transmittance for a film made of TPS Tf is 77.4%, for film made of TPS DPTe-TFPS is 72.70% and for a film made of TPS DPDITe-TFPS is 67.0% %. These data confirms the significant increase in PAG absorption for tellurium-containing PAG compounds Table 1 below shows the calculated % transmission of compositions that comprise the base polymer P1 (shown in FIG. 2) and Te-salt. Comparative compositions C1 to C3 comprise polymer P1 and the photoacid generator triphenylsulfonium triflate (TPS TO at 5, 10, or 15 mol % respectively. The inventive compositions I1 to I3 comprise polymer P1 and the photoacid generator TPS DPTe-TFPS at 5, 10 or 15 mol % respectively. The inventive compositions I4 to I6 comprise polymer P1 and the photoacid generator TPS DPDITe-TFPS at 5 10, and 15 mol % respectively. As can be seen from Table 1, less transmission and by definition increased absorbance is obtained for formulations that comprise the inventive examples. Interestingly, the transmittance of comparative formulation that comprise the PAG TPS Tf is not effected by the PAG loading amount. However, the transmission formulation I1 to I6 that comprise the inventive PAGs decrease with increasing PAG loading.

FIG. 2

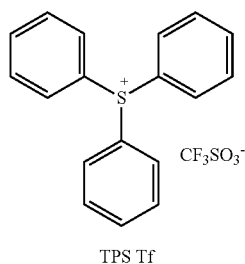

TPS Tf

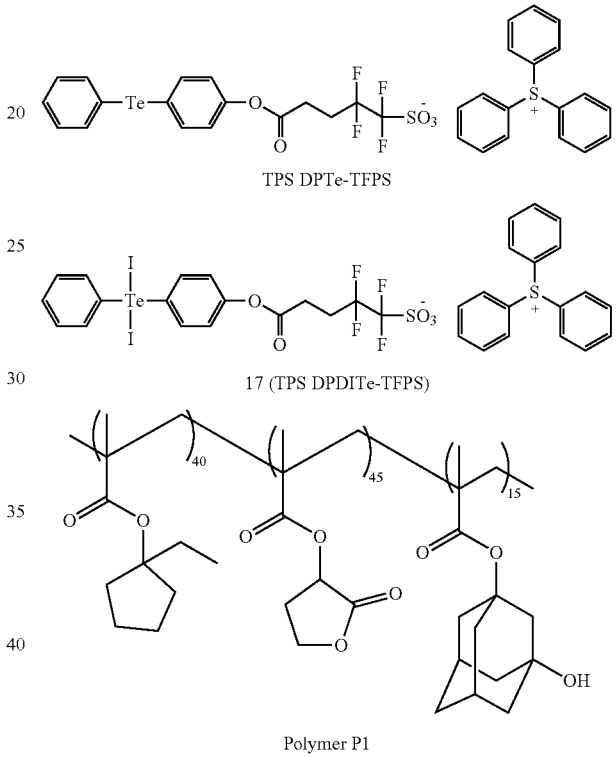

TPS DPTe-TFPS 17 (TPS DPDITe-TFPS)

Polymer P1

TABLE 1

| Composition | Polymer | PAG | PAG mol % in composition | 13.5 nm % Ttransmittance at FT = 60 nm |
|---|---|---|---|---|
| C1 (comparative) | P1 | TPS Tf | 5 | 74.63 |
| C2 (comparative) | P1 | TPS Tf | 10 | 74.13 |
| C3 (comparative) | P1 | TPS Tf | 15 | 74.27 |
| I1 | P1 | TPS DPTe-TFPS | 5 | 73.35 |
| I2 | P1 | TPS DPTe-TFPS | 10 | 72.46 |
| I3 | P1 | TPS DPTe-TFPS | 15 | 71.77 |
| I4 | P1 | TPS DPDITe-TFPS | 5 | 71.40 |
| I5 | P1 | TPS DPDITe-TFPS | 10 | 69.32 |
| I6 | P1 | TPS DPDITe-TFPS | 15 | 67.80 |

What is claimed is:

1. A photoresist composition comprising
a resin; and
a photoacid generator that comprises a salt comprising an anion component that comprises one or more Te atoms,
wherein the photoresist composition can be imaged with activating radiation and developed with alkaline aqueous developer.

2. A photoresist composition of claim 1 wherein the anion component comprises one or more divalent Te atoms.

3. A photoresist composition of claim 1 wherein the salt comprises one or more tetravalent Te atoms.

4. A photoresist composition of claim 1 wherein the salt corresponds to the following Formula (I):

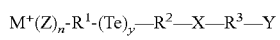
(I)

wherein $R^1$ is a non-hydrogen substituent;
$R^2$ is a chemical bond or a non-hydrogen substituent;
X is a chemical bond or a divalent linking group;
$R^3$ is a linker;
Z is absent or a non-hydrogen substituent;
Y is an anionic group;
n is an integer equal to or greater than 0; and y is an integer equal to or greater than 1; and
$M^+$ is a cation component.

5. A photoresist composition of claim 1 wherein the salt corresponds to the following Formula (II):

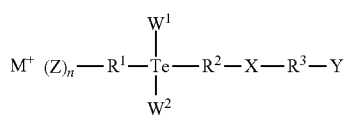
(II)

wherein $W^1$ and $W^2$ are each the same or different non-hydrogen substituents;
$R^1$ is a non-hydrogen substituent;
$R^2$ is a chemical bond or a non-hydrogen substituent;
X is a chemical bond or a divalent linking group;
$R^3$ is a linker;
Z is absent or a non-hydrogen substituent;
Y is an anionic group;
n is an integer equal or greater than 0; and y is an integer equal or greater than 1; and
$M^+$ is a cation component.

6. A photoresist composition of claim 1 wherein the salt comprises a cation component that comprise one or more $I^+$, $S^+$, $Se^+$ and/or $Te^+$.

7. A photoresist composition of claim 1 wherein the salt comprises a polymerizable group.

8. A photoresist composition of claim 1 wherein the salt comprises one or more acid-labile groups.

9. The photoresist composition of claim 1 wherein the photoresist composition comprises one or more acid generator compounds that are distinct from the photoacid generator that comprises the salt comprising the anion component that comprises one or more Te atoms.

10. A method for providing a photoresist relief image comprising:
a) applying a coating layer of the photoresist composition of claim 1 on a substrate; and
b) exposing the photoresist composition layer to activating radiation and developing the exposed photoresist composition coating layer.

11. A photoresist composition of claim 1 wherein the salt comprises one or more of the following:

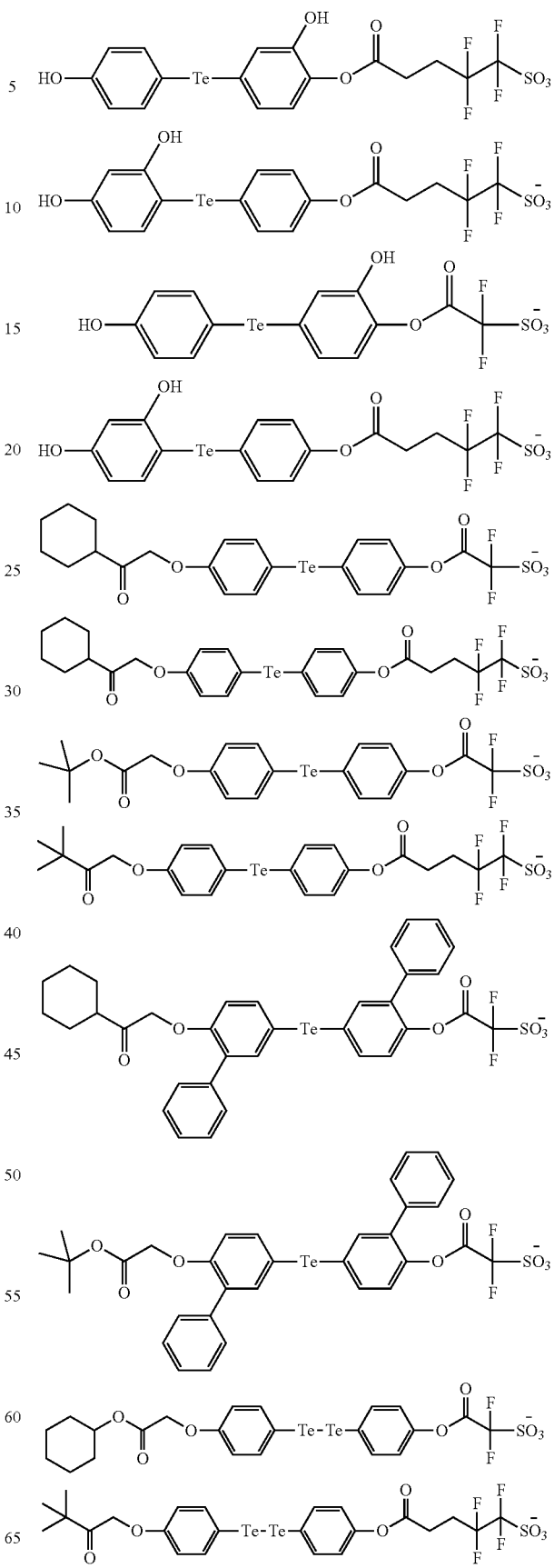

-continued

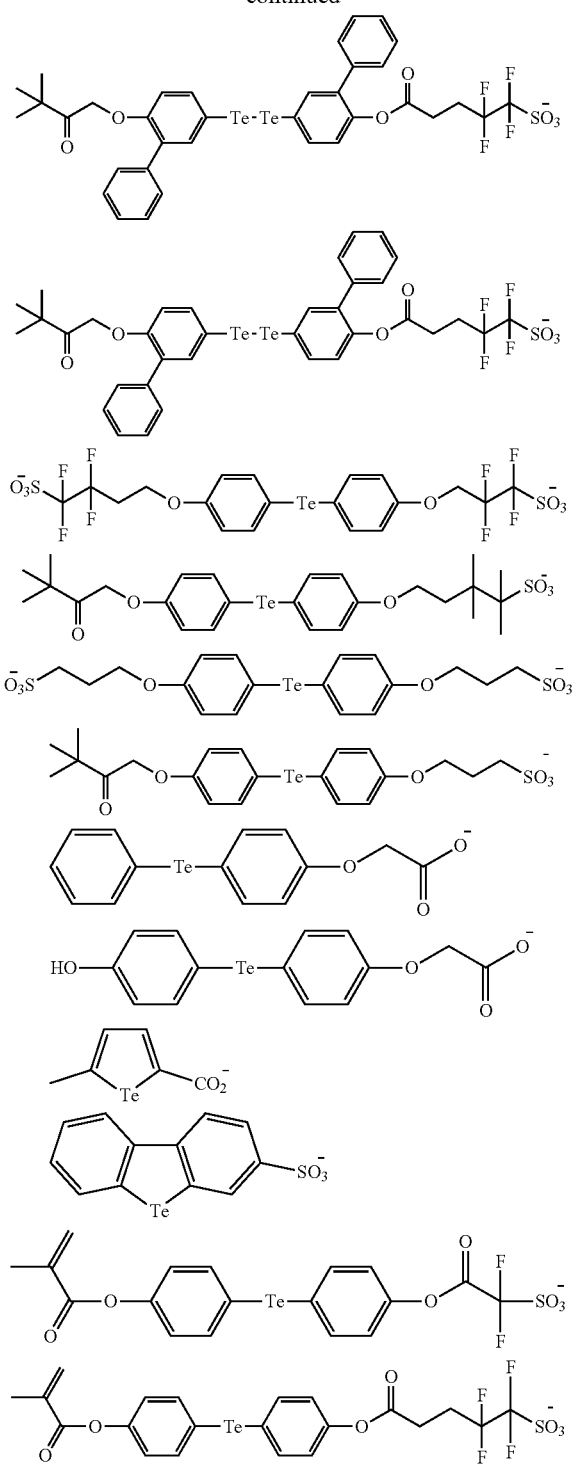

12. A photoresist composition of claim 1 wherein the salt comprises one or more of the following:

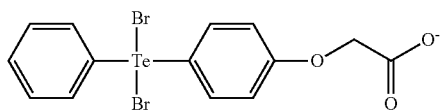

-continued

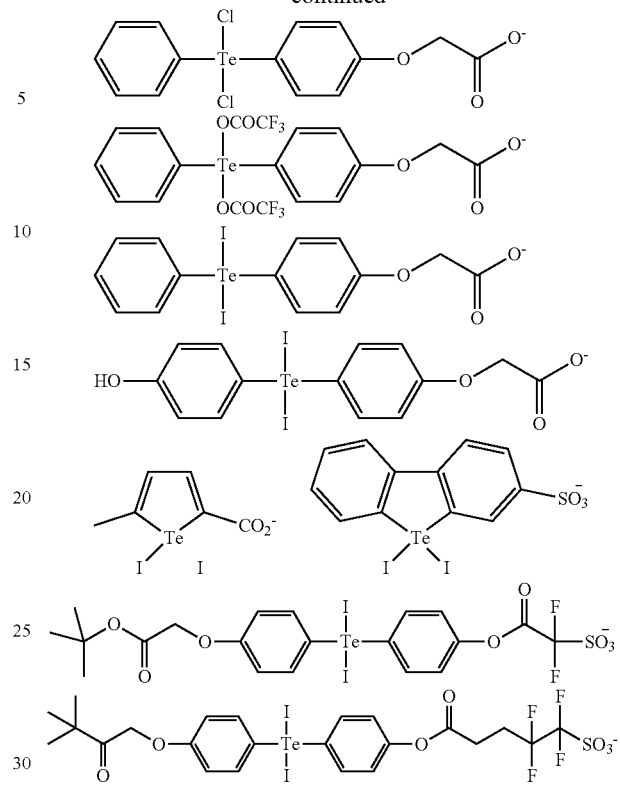

13. The photoresist composition of claim 1 wherein the photoresist composition is positive-acting.

14. The method of claim 10 wherein the photoresist composition is imaged with EUV radiation.

15. The method of claim 10 wherein the anion component comprises one or more divalent Te atoms.

16. The method of claim 10, wherein the salt comprises one or more tetravalent Te atoms.

17. The method of claim 10, wherein the salt corresponds to the following Formula (I):

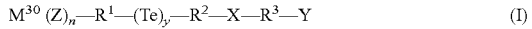

wherein $R^1$ is a non-hydrogen substituent;
$R^2$ is a chemical bond or a non-hydrogen substituent; X is a chemical bond or a divalent linking group;
$R^3$ is a linker;
Z is absent or a non-hydrogen substituent;
Y is an anionic group;
n is an integer equal to or greater than 0; and y is an integer equal to or greater than 1; and
$M^+$ is a cation component.

18. The method of claim 10, wherein the salt corresponds to the following Formula (II):

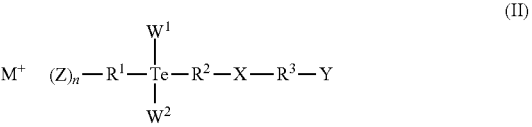

wherein $W^1$ and $W^2$ are each the same or different non-hydrogen substituents;
$R^1$ is a non-hydrogen substituent;
$R^2$ is a chemical bond or a non-hydrogen substituent;

X is a chemical bond or a divalent linking group;
R³ is a linker;
Z is absent or a non-hydrogen substituent;
Y is an anionic group;
n is an integer equal or greater than 0; and y is an integer equal or greater than 1; and
M+ is a cation component.

19. The method of claim 10, wherein the salt comprises a cation component that comprise one or more $I^+$, $S^+$, $Se^+$ and/or $Te^+$.

20. The method of claim 10, wherein the salt comprises a polymerizable group, one or more acid-labile groups, or a combination thereof.

* * * * *